(12) United States Patent
Um et al.

(10) Patent No.: US 12,555,749 B2
(45) Date of Patent: Feb. 17, 2026

(54) SUBSTRATE TREATING METHOD AND SUBSTRATE TREATING APPARATUS

(71) Applicant: SEMES CO., LTD., Cheonan-si (KR)

(72) Inventors: Young Je Um, Busan (KR); Wan Jae Park, Hwaseong-si (KR); Dong-Hun Kim, Seoul (KR); Seong Gil Lee, Hwaseong-si (KR); Ji Hoon Park, Suwon-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 589 days.

(21) Appl. No.: 17/868,067

(22) Filed: Jul. 19, 2022

(65) Prior Publication Data

US 2023/0026796 A1    Jan. 26, 2023

(30) Foreign Application Priority Data

Jul. 21, 2021    (KR) .................. 10-2021-0095577

(51) Int. Cl.
*H01L 21/683*    (2006.01)
*H01J 37/32*    (2006.01)

(52) U.S. Cl.
CPC .... *H01J 37/3244* (2013.01); *H01J 37/32422* (2013.01); *H01J 37/32568* (2013.01); *H01L 21/6833* (2013.01)

(58) Field of Classification Search
None
See application file for complete search history.

(56) References Cited

U.S. PATENT DOCUMENTS

| | | | | |
|---|---|---|---|---|
| 5,013,400 | A * | 5/1991 | Kurasaki | H01L 21/76804 156/345.43 |
| 9,449,845 | B2 * | 9/2016 | Liu | H01J 37/32357 |
| 9,659,792 | B2 * | 5/2017 | Wang | H01J 37/32357 |
| 10,424,485 | B2 * | 9/2019 | Ingle | H01J 37/32357 |
| 12,106,936 | B2 * | 10/2024 | Kurunczi | H01J 37/32357 |
| 2001/0003678 | A1 * | 6/2001 | Stinnett | H01L 21/76804 438/692 |
| 2009/0121309 | A1 * | 5/2009 | Kim | H10D 64/518 257/E29.02 |

(Continued)

FOREIGN PATENT DOCUMENTS

| | | |
|---|---|---|
| JP | 2014-204030 A | 10/2014 |
| JP | 2015-088751 A | 5/2015 |

(Continued)

OTHER PUBLICATIONS

Japanese Office Action, dated Jul. 18, 2023, issued in corresponding Japanese Patent Application No. 2022-111391.

(Continued)

*Primary Examiner* — Allan W. Olsen
(74) *Attorney, Agent, or Firm* — Harness, Dickey & Pierce, P.L.C.

(57) ABSTRACT

The inventive concept provides a substrate treating method. The substrate treating method for treating a substrate at which thin films are stacked and a hole is formed thereon including treating the substrate using a first plasma including an ion, which is a first treating step; and treating the substrate using a second plasma removed of an ion, which is a second treating step.

18 Claims, 12 Drawing Sheets

(56) References Cited

U.S. PATENT DOCUMENTS

| | | | |
|---|---|---|---|
| 2011/0053381 A1* | 3/2011 | Kobayashi | H01L 21/76232 438/726 |
| 2013/0089988 A1* | 4/2013 | Wang | H01L 21/3081 438/719 |
| 2015/0083582 A1* | 3/2015 | Dhindsa | H01L 21/67069 204/298.35 |
| 2016/0076142 A1* | 3/2016 | Sheng | H01J 37/08 118/723 FI |
| 2016/0314961 A1* | 10/2016 | Liu | H01L 21/02598 |
| 2017/0194430 A1* | 7/2017 | Wood | H10D 30/6735 |
| 2017/0256415 A1* | 9/2017 | Kim | H01J 37/32357 |
| 2018/0294144 A1* | 10/2018 | Aubuchon | C23C 16/5096 |
| 2019/0122902 A1* | 4/2019 | Ko | H01L 21/31116 |
| 2020/0152493 A1* | 5/2020 | Colombeau | H01L 21/67196 |
| 2020/0168463 A1* | 5/2020 | Ko | H01L 21/3081 |
| 2020/0335339 A1* | 10/2020 | Yang | H01L 21/0338 |
| 2021/0020405 A1* | 1/2021 | Ventzek | C23C 16/45544 |
| 2021/0020445 A1* | 1/2021 | Wang | H01L 21/0217 |
| 2022/0102144 A1* | 3/2022 | Feng | H01L 21/31138 |
| 2022/0189771 A1* | 6/2022 | Lee | C23C 16/466 |
| 2023/0066543 A1* | 3/2023 | Dai | H01L 21/31053 |
| 2024/0266148 A1* | 8/2024 | Lee | H01J 37/32724 |

FOREIGN PATENT DOCUMENTS

| | | |
|---|---|---|
| JP | 2017-85161 A | 5/2017 |
| JP | 2019-035147 A | 3/2019 |
| JP | 2019-176184 A | 10/2019 |
| JP | 2020-155387 A | 9/2020 |
| WO | WO-2020/161879 A1 | 8/2020 |

OTHER PUBLICATIONS

Japanese Office Action dated Dec. 12, 2023 issued in corresponding Japanese Patent Application No. 2022-111391.

* cited by examiner

SUBSTRATE TREATING METHOD AND SUBSTRATE TREATING APPARATUS

CROSS-REFERENCE TO RELATED APPLICATIONS

A claim for priority under 35 U.S.C. § 119 is made to Korean Patent Application No. 10-2021-0095577 filed on Jul. 21, 2021, in the Korean Intellectual Property Office, the entire contents of which are hereby incorporated by reference.

BACKGROUND

Embodiments of the inventive concept described herein relate to a substrate treating method and a substrate treating apparatus.

In a fabrication of a semiconductor device, a desired pattern is formed on a substrate such as a wafer through various processes such as a photography, an etching, an ashing, an ion implantation, and a thin film deposition.

FIG. 1 illustrates illustrating a state of a substrate on which a treating process has been partially performed. Referring to FIG. 1, a first thin film L1 and a second thin film L2 may be stacked on the substrate W on which the treating process is partially performed, and a hole H penetrating the first thin film L1 and the second thin film L2 may be formed through a treating such as an etching. The first thin film L1 and the second thin film L2 may be formed of different materials. For example, the first thin film L1 may be provided as a material including an SiO, and the second thin film L2 may be provided as a material including an SiN. As described above, the first thin film L1 and the second thin film L2, which are different materials, have different physical properties. Accordingly, a roughness may occur at the hole H formed on the substrate W during the treating process. In addition, a damage layer DL may be formed on the substrate W during the treating process such as an etching. The damage layer DL may be formed of a material containing an Si.

In general, a chemical is supplied onto the substrate W to remove the roughness of the hole H and the damage layer DL. Recently, as an aspect ratio AR of the hole H is increased due to a densification of a pattern formed on the substrate W, the chemical may not properly permeate into the hole H, and thus the damage layer DL on the substrate W may not be appropriately removed. In addition, since the first thin film L1 and the second thin film L2 have different selection ratios with respect to the chemical, the roughness of the hole H may not be improved even when the chemical appropriately permeates into the hole H.

SUMMARY

Embodiments of the inventive concept provide a substrate treating method and a substrate treating apparatus capable of efficiently treating a substrate.

Embodiments of the inventive concept provide a substrate treating method and a substrate treating apparatus capable of effectively removing a damage layer formed on a substrate.

Embodiments of the inventive concept provide a substrate treating method and a substrate treating apparatus capable of effectively improving a roughness of a hole formed on a substrate when two or more thin films having different selection ratios are stacked on the substrate.

Embodiments of the inventive concept provide a substrate treating method and a substrate treating apparatus capable of performing both a substrate treatment by an ion and a substrate treatment by a radical.

The technical objectives of the inventive concept are not limited to the above-mentioned ones, and the other unmentioned technical objects will become apparent to those skilled in the art from the following description.

The inventive concept provides a substate treating method for treating a substrate at which thin films are stacked and a hole is formed. The substrate treating method includes treating the substrate using a first plasma including an ion, which is a first treating step; and treating the substrate using a second plasma removed of an ion, which is a second treating step.

In an embodiment, during at least a part of a period during which the first treating step is being performed the substrate is chucked with an electrostatic force.

In an embodiment, the first treating step generates the first plasma by supplying a process gas to a first place within a chamber, and the second treating step generates the second plasma by supplying a process gas to a second place within the chamber which is different from the first space.

In an embodiment, the first place is a space for placing the substrate thereon, and a removing of an ion of the second plasma is done by an ion blocker positioned between the first place and the second place.

In an embodiment, the first treating step forms an electric field at the first space after a set time has passed since a supplying of a process gas for exciting to the first plasma is started.

In an embodiment, the second treating step forms an electric field at the second space after a set time has passed since a supplying of a process gas for exciting to the second plasma is started.

In an embodiment, between the first treating step and the second treating step an exhaust step for exhausting the first step is performed.

In an embodiment, a temperature of a chuck supporting the substrate while the substrate is being treated is controlled to 85° C. to 130° C.

In an embodiment, a pressure of the first treating space at the first treating step is controlled to 10 mTorr to 100 mTorr, and a pressure of the first treating space at the second treating step is controlled to 1 Torr to 10 Torr.

In an embodiment, 100 W to 1000 W is applied to a first electrode forming an electric field at the first space in the first treating step, and 50 W to 100 W is applied to a second electrode forming an electric field at the second space in the second treating step.

In an embodiment, a process gas excited to the first plasma includes a hydrogen, and a process gas excited to the second plasma includes a fluorine.

In an embodiment, the process gas excited to the first plasma is supplied to the first space at 100 sccm to 1000 sccm.

In an embodiment, the process gas excited to the second plasma is supplied to the second space at 10 sccm to 500 sccm.

The inventive concept provides a substate treating method for treating a substrate at which at least two or more thin films having a different selection ratio are stacked. The substrate treating method includes treating the substrate, which has been chucked with an electrostatic force, using a first plasma including an ion, which is a first treating step; and treating the substrate using a second plasma removed of an ion, which a second treating step performed after the first treating step, and wherein the first plasma is a plasma excited from a process gas including a hydrogen, an argon, and a helium, and the second plasma is a plasma excited from a process gas including a fluorine.

In an embodiment, a first place at which the first plasma is generated and a second place at which the second plasma is generated is divided by a grounded plate.

In an embodiment, at the second treating step, a process gas including a nitrogen and a hydrogen is supplied to the second plasma removed of an ion.

The inventive concept provides a substate treating apparatus. The substrate treating apparatus includes a housing defining a treating space; a chuck supporting a substrate at the treating space and providing a bottom electrode connecting a bottom power source generating a plasma at the treating space; a top electrode connecting to a top power source; an ion blocker positioned opposite to the top electrode and dividing a plasma space fluid communicating with the treating space, and the top electrode generating a plasma at the plasma space; a gas supply unit for supplying a process gas to the treating space or the plasma space; and a controller, and wherein the controller controls the top power source, the bottom power source, and the gas supply unit so the substrate is treated by generating the plasma at the plasma space, after the substrate is treating by generating the plasma at the treating space.

In an embodiment, the controller supplies a process gas including a hydrogen to the treating space, when the plasma is generated at the treating space.

In an embodiment, a process gas including a fluorine is supplied to the plasma space, when the plasma is generated at the plasma space.

In an embodiment, an electrostatic electrode for chucking the substrate with an electrostatic force is provided.

According to an embodiment of the inventive concept, a substrate may be efficiently treated.

According to an embodiment of the inventive concept, a damage layer formed on a substrate may be effectively removed.

According to an embodiment of the inventive concept, a roughness of a hole formed on a substrate may be effectively improved when two or more thin films having different selection ratios are stacked on the substate.

According to an embodiment of the inventive concept, a substrate treatment by an ion and a substrate treatment by a radical may both be performed.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
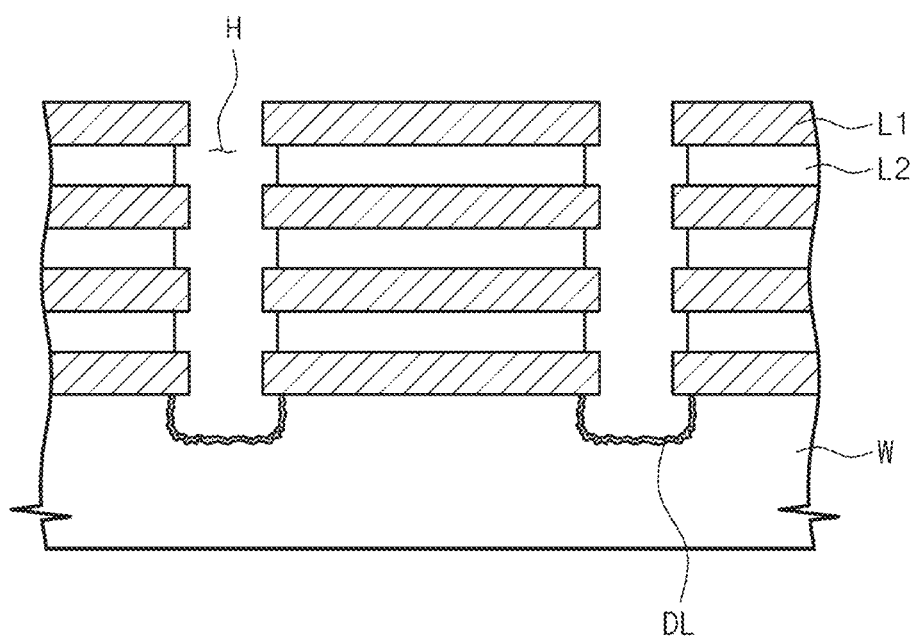
FIG. 1 illustrates a state of a substrate on which a treating process has been partially performed.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises", "comprising,", "includes", and/or "including" when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "example" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Other terms such as "between", "adjacent", "near" or the like should be interpreted in the same way.

Unless otherwise defined, all terms used herein, including technical or scientific terms, have the same meaning as those generally understood by those skilled in the art to which the inventive concept belongs. Terms such as those defined in commonly used dictionaries should be interpreted as consistent with the context of the relevant technology and not as ideal or excessively formal unless clearly defined in this application.

Hereinafter, an embodiment of the inventive concept will be described with reference to FIG. 2 to FIG. 13.

Figure 2:
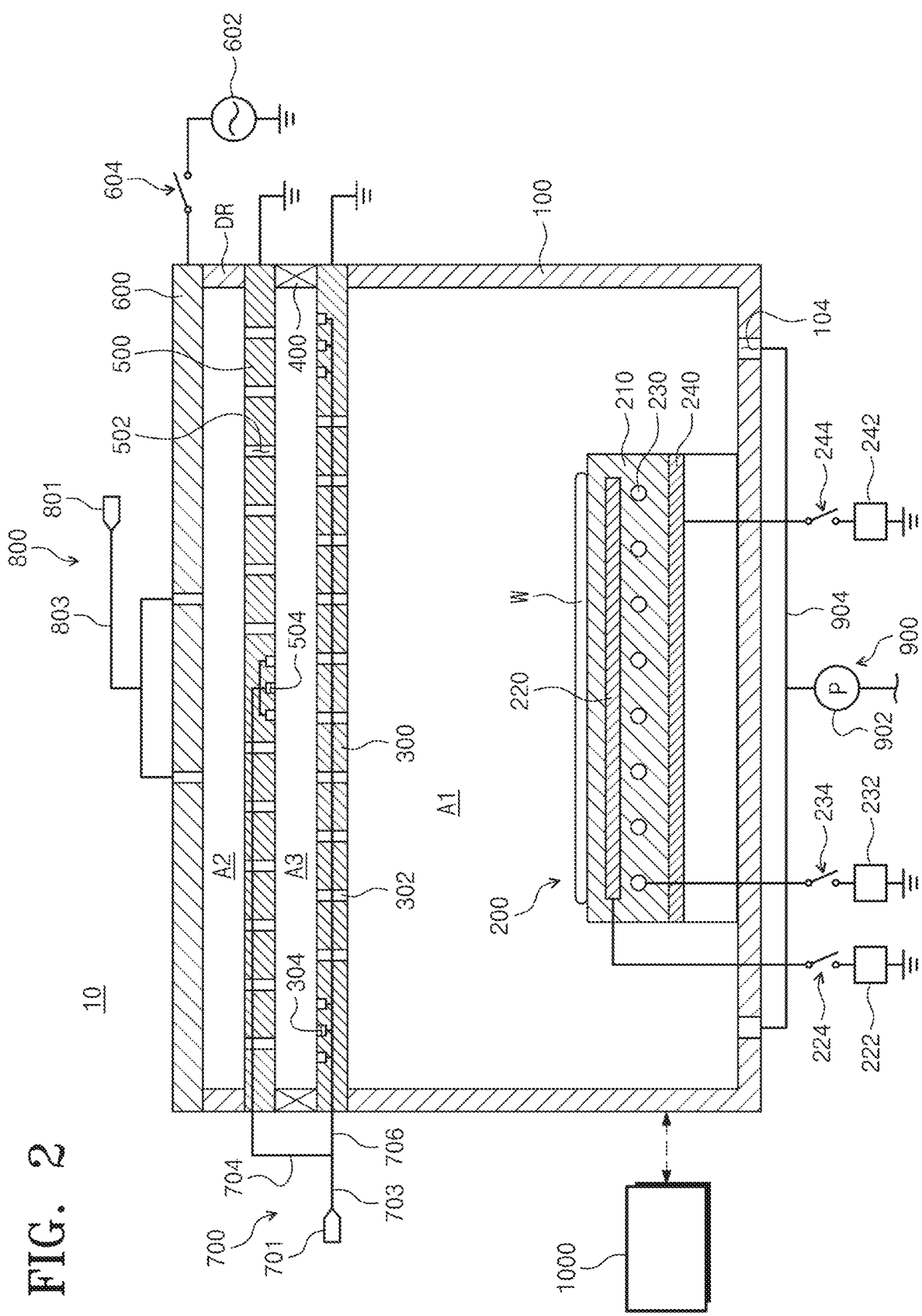
FIG. 2 illustrates a substrate treating apparatus according to an embodiment of the inventive concept.

FIG. 2 schematically illustrates a substrate treating apparatus according to an embodiment of the inventive concept. Referring to FIG. 2, the substrate treating apparatus 10 according to an embodiment of the inventive concept may treat a substrate W. The substrate treating apparatus 10 may treat the substrate W using a plasma. The substrate treating apparatus 10 may remove a thin film formed on the substrate W using the plasma. For example, the substrate treating apparatus 10 may supply an etchant to the substrate W to remove the thin film formed on the substrate W. For example, the substrate treating apparatus 10 may remove the thin film including a silicon Si formed on the substrate W. For example, the substrate treating apparatus 10 may etch a substrate W having an Si, an $SiO_2$, an $Si_3N_4$, and a Poly Si film without a particle contamination. The substrate W may be a wafer.

The substrate treating apparatus 10 may include a housing 100, a chuck 200, a shower head 300, a heating member 400, an ion blocker 500, an insulating member DR, a top electrode 600 (an exemplary second electrode), gas supply units 700 and 800, an exhaust unit 900, and a controller 1000.

The housing 100 and the shower head 300 may be combined with each other to define a treating space A1 (an exemplary first space) in which the substrate W is treated. Also, the shower head 300, the heating member 400, and the ion blocker 500 may be combined with each other to define a mixing space A3 (an exemplary third space) in which a plasma P in which an ion I has been removed and a first process gas G1 supplied by a first gas supply unit 700 is mixed. The ion blocker 500, the insulating member DR, and the top electrode 600 may be combined with each other to define a plasma space A2 (an exemplary second space) in which the plasma P is generated. Components involved in defining the treating space A1, the plasma space A2, and the mixing space A3 may be collectively referred to as a chamber.

The housing 100 may define the treating space A1. For example, the housing 100 in combination with the shower head 300 may define the treating space A1. The housing 100 may have a container shape with an open top. An inner wall of the housing 100 may be coated with a material capable of preventing the plasma P to be described later from etching the inner wall thereof. For example, the inner wall of the housing 100 may be coated with a dielectric film such as a ceramic. In addition, the housing 100 may be grounded. In addition, a door (not illustrated) may be installed in the housing 100 so that the substrate W may be brought into the treating space A1 or taken out of the treating space A1. The door may be selectively open and closed.

The chuck 200 may support the substrate W in the treating space A1. The chuck 200 may heat the substrate W. In addition, the chuck 200 may be an electrostatic chuck (ESC) capable of chucking the substrate W using an electrostatic force. The chuck 200 may include a support plate 210, an electrostatic electrode 220, a heater 230, and a bottom electrode (an exemplary first electrode).

The support plate 210 may support the substrate W. The support plate 210 may have a support surface supporting the substrate W. The support plate 210 may be provided as a dielectric. For example, the support plate 210 may be made of a ceramic material. The electrostatic electrode 220 may be provided in the support plate 210. The electrostatic electrode 220 may be provided at a position overlapping the substrate W when viewed from above. For example, a substantial portion of the electrostatic electrode 220 may overlap with the substrate W. When a power is applied to the electrostatic electrode 220, the electrostatic electrode 220 may form an electric field by an electrostatic force capable of chucking the substrate W. The resulting attractive force by the electric field may chuck the substrate W in a direction toward the support plate 210. Also, the electric field may make the ion I to be described later move (so, therefore, the ion I has an anisotropic state) in a forward direction toward the substrate W.

In addition, the substrate treating apparatus 10, for example, the chuck 200, may include first power modules 222 and 224 that apply the power to the electrostatic electrodes 220. The first power modules 222 and 224 may include an electrostatic electrode power source 222 and an electrostatic electrode switch 224. The power may be applied to the electrostatic electrode 220 according to an on/off of the electrostatic electrode switch 224.

The heater 230 may heat the substrate W. The heater 230 may heat the substrate W by increasing a temperature of the support plate 210. In addition, when the power is applied to the heater 230, the heater 230 may generate a heat. The heater 230 may be a heating element such as a tungsten. However, the type of the heater 230 is not limited thereto, and may be variously modified to a known heater. The heater 230 may increase the temperature of the support plate 210 to prevent by-products (for example, Si-polymer) separated from the substrate W while the substrate is being treated from being reattached to the hole H. For example, the heater 230 may control the temperature of the support plate 210 to 85° C. to 130° C.

In addition, the substrate treating apparatus 10, for example, the chuck 200, may include second power modules 232 and 234, which apply the power to the heater 230. The second power modules 232 and 234 may include a heater power source 232 and a heater power switch 234. The power may be applied to the heater 230 according to an on/off of the heater power switch 234.

The bottom electrode 240 may generate the plasma in the treating space A1. The bottom electrode 240 may have a plate shape. The bottom electrode 240 may be an electrode facing the shower head 300 to be described later. When a power is applied to the bottom electrode 240, the bottom electrode 240 forms the electric field in the treating space A1, and a formed electric field may generate the plasma P by exciting process gases G1 and G2 introduced (supplied) into the treating space A1. In addition, the substrate treating apparatus 10, for example, the chuck 200 may include bottom power supply modules 242 and 244 for applying the power to the bottom electrode 240. The bottom power modules 242 and 244 may include a bottom power source 242 which is an RF sources and a bottom power switch 244. The power may be applied to the bottom electrode 240 according to on/off of the bottom power switch 244.

The shower head 300 may be disposed on the top of the housing 100. The shower head 300 may be disposed between the ion blocker 500 to be described later and the treating space A1. The shower head 300 may be grounded. The shower head 300 may be grounded to function as an opposite electrode with the above-mentioned bottom electrode 240. In addition, a plurality of holes 302 may be formed at the shower head 300. The holes 302 may be formed to extend from a top surface to a bottom surface of the shower head 300. That is, the holes 302 may be formed through the shower head 300. The hole 302 may fluidly communicate the treating space A1 with the plasma space A2 to be described later. In addition, the hole 302 may fluidly communicate the treating space A1 with the mixing space A3 to be described later.

In addition, a gas inlet 304 may be formed at the shower head 300. The gas inlet 304 may be connected to a second gas line 706 to be described later. The gas inlet 304 may be configured to supply a first process gas G1 toward the mixing space A3. The gas inlet 304 may be configured to supply the process gas to an edge region of the mixing space A3. The gas inlet 304 may be configured such that a gas discharge direction faces the mixing space A3 (also indirectly faces the plasma space A2), but does not face the treating space A1.

The heating member 400 may be disposed above the shower head 300. The heating member 400 may be a ring heater having a ring shape when viewed from above. The heating member 400 may generate a heat to increase a temperature of the mixing space A3 so that the plasma P from which an ion is removed and the first process gas G1 may be more effectively mixed.

The ion blocker 500 may separate the plasma space A2 and the mixing space A3 (further, indirectly separate the plasma space A2 and the treating space A1). The ion blocker 500 may be disposed between the top electrode 600 and the treating space A1. In addition, the ion blocker 500 may be disposed between the treating space A1 and the plasma space A2.

The ion blocker 500 may be disposed on the top of the heating member 400. The ion blocker 500 may be grounded. The ion blocker 500 may be grounded to remove the ion I included in the plasma P, when the plasma P generated at the plasma space A2 flows into the mixing space A3, and further, the treating space A1. In short, since the plasma P generated at the plasma space A2 removes the ion I while going through the ion blocker 500, it may substantially include only the radical R.

In addition, the ion blocker 500 may be grounded and function as an electrode opposite to the top electrode 600 to be described later. A plurality of through holes 502 may be formed at the ion blocker 500. The through holes 502 may be formed through the ion blocker 500. The through holes 502 may fluidly communicate the plasma space A2 with the mixing space A3. The through holes 502 may fluidly communicate the plasma space A2 with the treating space A1.

In addition, a gas supply port 504 may be formed at the ion blocker 500. The gas supply port 504 may be connected to a first gas line 704 to be described later. The gas supply port 504 may be configured to supply a process gas to the mixing space A3. The gas supply port 504 may be configured such that a gas discharge direction faces the mixing space A3 (also indirectly faces the treating space A1), but does not face the plasma space A2.

The top electrode 600 may have a plate shape. The top electrode 600 may generate the plasma. The top power modules 602 and 604 included in the substrate treating apparatus 10 may apply a power to the top electrode 600. The top power modules 602 and 604 may include a top power source 602 which is an RF source and a top power switch 604. The power may be applied to the top electrode 600 according to an on/off of the top power switch 602. When the power is applied to the top electrode 600, an electric field is formed between the ion blocker 500 functioning as an opposite electrode and the top electrode 600, and thus a second process gas G2 may be excited to generated the plasma. In addition, the insulating member DR provided as an insulating material may be disposed between the top electrode 600 and the ion blocker 500. The insulating member DR may have a ring shape when viewed from above.

The gas supply units 700 and 800 may supply a process gas G1 and G2 for exciting into a plasma state P. The gas supply units 700 and 800 may include a first gas supply unit 700 and a second gas supply unit 800.

Hereinafter, a gas supplied by the first gas supply unit 700 is referred to as a first process gas G1, and a gas supplied by the second gas supply unit 800 is referred to as a second process gas G2.

The first gas supply unit 700 may supply a process gas to the mixing space A3. The first gas supply unit 700 may supply a process gas to the treating space A1 by injecting the process gas to the mixing space A3. The first gas supply unit 700 may include a first gas supply source 701, a main gas line 703, a first gas line 704, and a second gas line 706. An end of the main gas line 703 may be connected to the first gas supply source 701, and another end of the main gas line 703 may branch to the first gas line 704 and the second gas line 706. The first gas line 704 may be connected to the gas supply port 504 of the ion blocker 500 described above. In addition, the second gas line 706 may be connected to the gas inlet 304 of the shower head 300 described above.

The first process gas G1 supplied by the first gas supply unit 700 may be at least one selected from a group consisting of an $NH_3$ and an $H_2$.

The second gas supply unit 800 may supply a process gas to the plasma space A2. The second gas supply unit 800 may supply the process gas to the mixing space A3 and the treating space A1 by injecting the process gas to the plasma space A2. The second gas supply unit 800 may include a second gas supply source 801 and gas channel 803. And end of the gas channel 803 may be connected to the second gas supply source 801, and the other end may be communicating with the plasma space A2.

The second process gas G2 supplied by the second gas supply unit 800 may be at least one of an He, an Ar, an Xe, an $N_2$, a fluorine-based gas (for example, $NF_3$, $F_2$) or combinations thereof.

The exhaust unit 900 may discharge a process gas G1 and G2 suppled to the treating space A1, process by-products, and the like. The exhaust unit 900 may adjust a pressure of the treating space A1. The exhaust unit 900 may include a decompression member 902 and decompression line 904. The decompression member 902 may be a pump. However, the inventive concept is not limited thereto, and may be variously modified into a known device that provides a decompression.

The controller 1000 may control the substrate treating apparatus 10, specifically, components of the substrate treating apparatus 10. For example, the controller 1000 may control the gas supply units 700 and 800, the first power modules 222 and 224, the second power modules 232 and 234, the decompression member 902, the bottom power modules 242 and 244, and the top power modules 602 and 604. The controller may comprise a process controller consisting of a microprocessor (computer) that executes a control of the substrate treating apparatus, a user interface such as a keyboard via which an operator inputs commands to manage the substrate treating apparatus, and a display showing the operation situation of the substrate treating apparatus, and a memory unit storing a treating recipe, i.e., a control program to execute treating processes of the substrate treating apparatus by controlling the process controller or a program to execute components of the substrate treating apparatus according to data and treating conditions. In addition, the user interface and the memory unit may be connected to the process controller. The treating recipe may be stored in a storage medium of the storage unit, and the storage medium may be a hard disk, a portable disk, such as a CD-ROM or a DVD, or a semiconductor memory, such as a flash memory.

Hereinafter, a substrate treating method according to an embodiment of the inventive concept will be described. The substrate treating method described below may be performed by the substrate treating apparatus 10 described above. In addition, in order to perform the substrate treating method described below, the controller 1000 may control components of the substrate treating apparatus 10.

Figure 3:
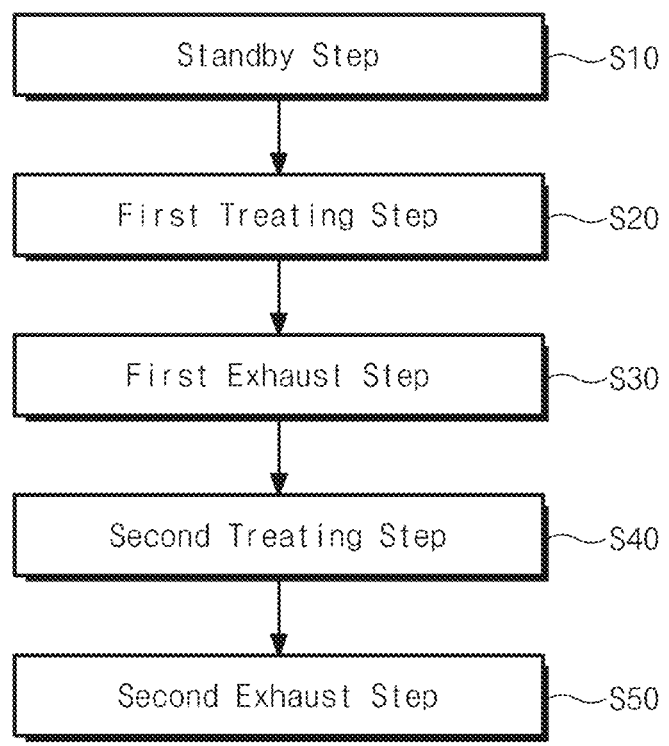
FIG. 3 is a flowchart illustrating a substrate treating method according to an embodiment of the inventive concept.
Figure 4:
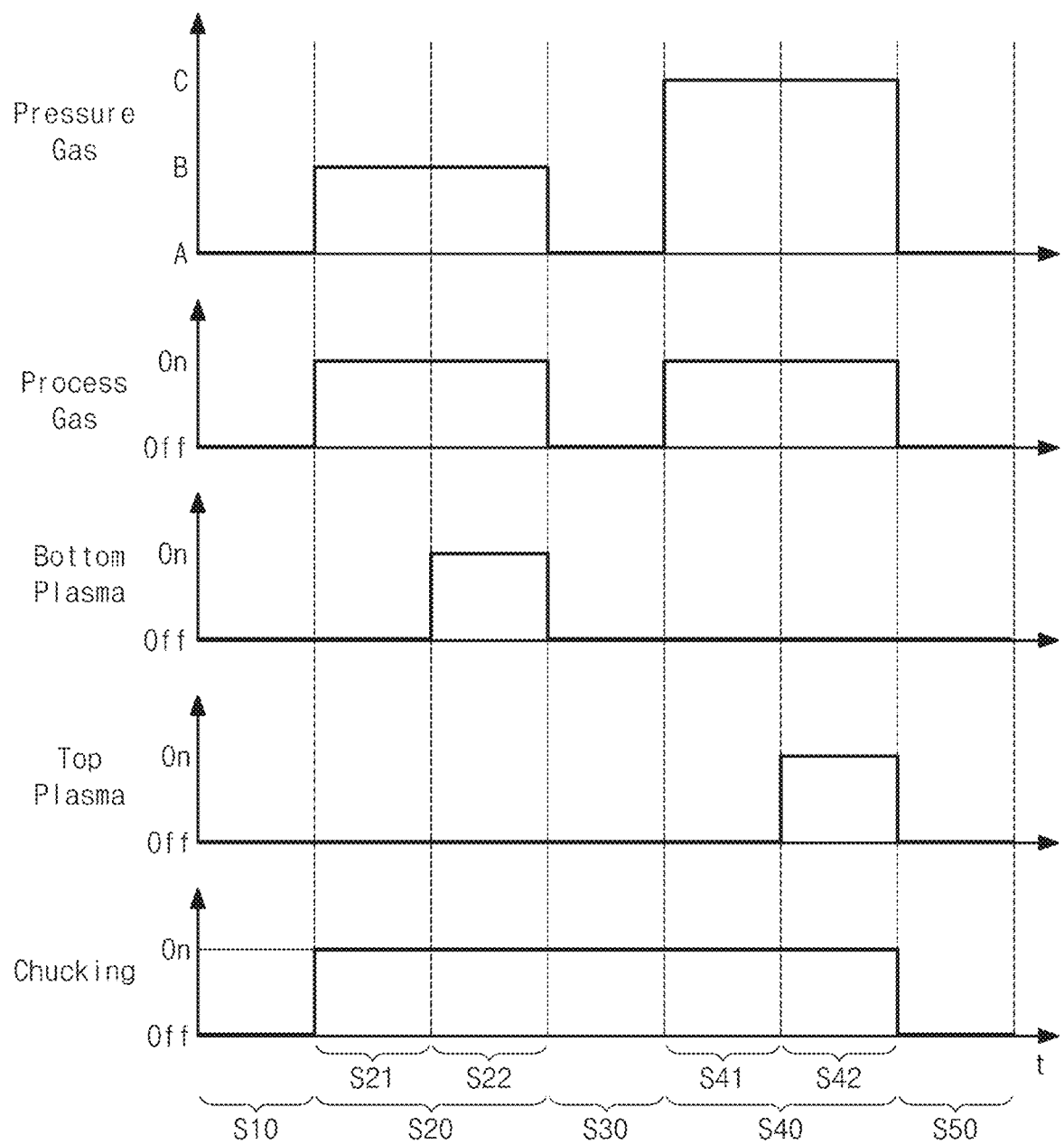
FIG. 4 is a graph schematically illustrating a treating condition of the substrate treating apparatus when performing the substrate treating method of FIG. 3.
Figure 5:
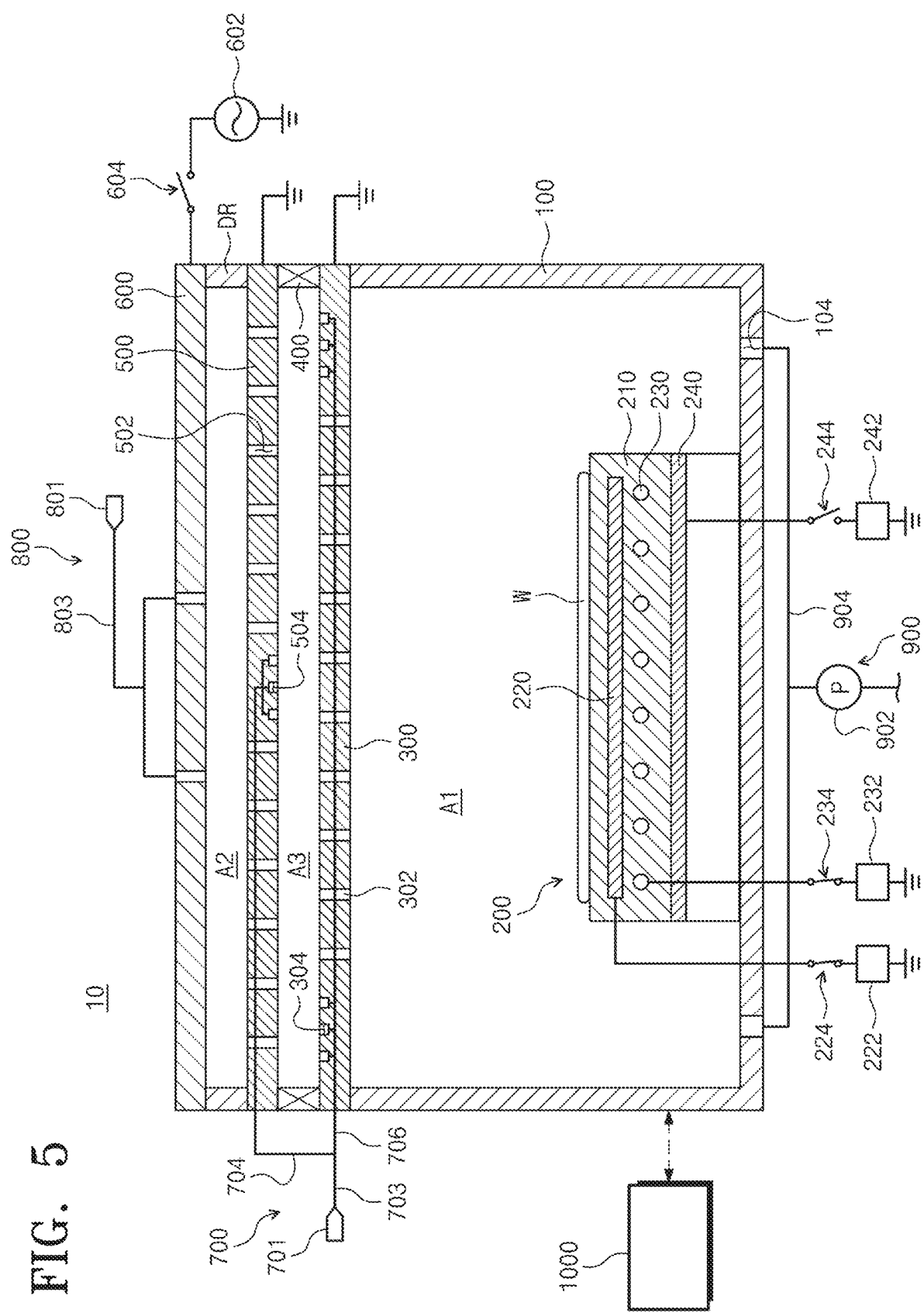
FIG. 5 illustrates the substrate treating apparatus at which a chucking of the substrate is performed in a chucking-pressure stabilizing step of FIG. 4.
Figure 6:
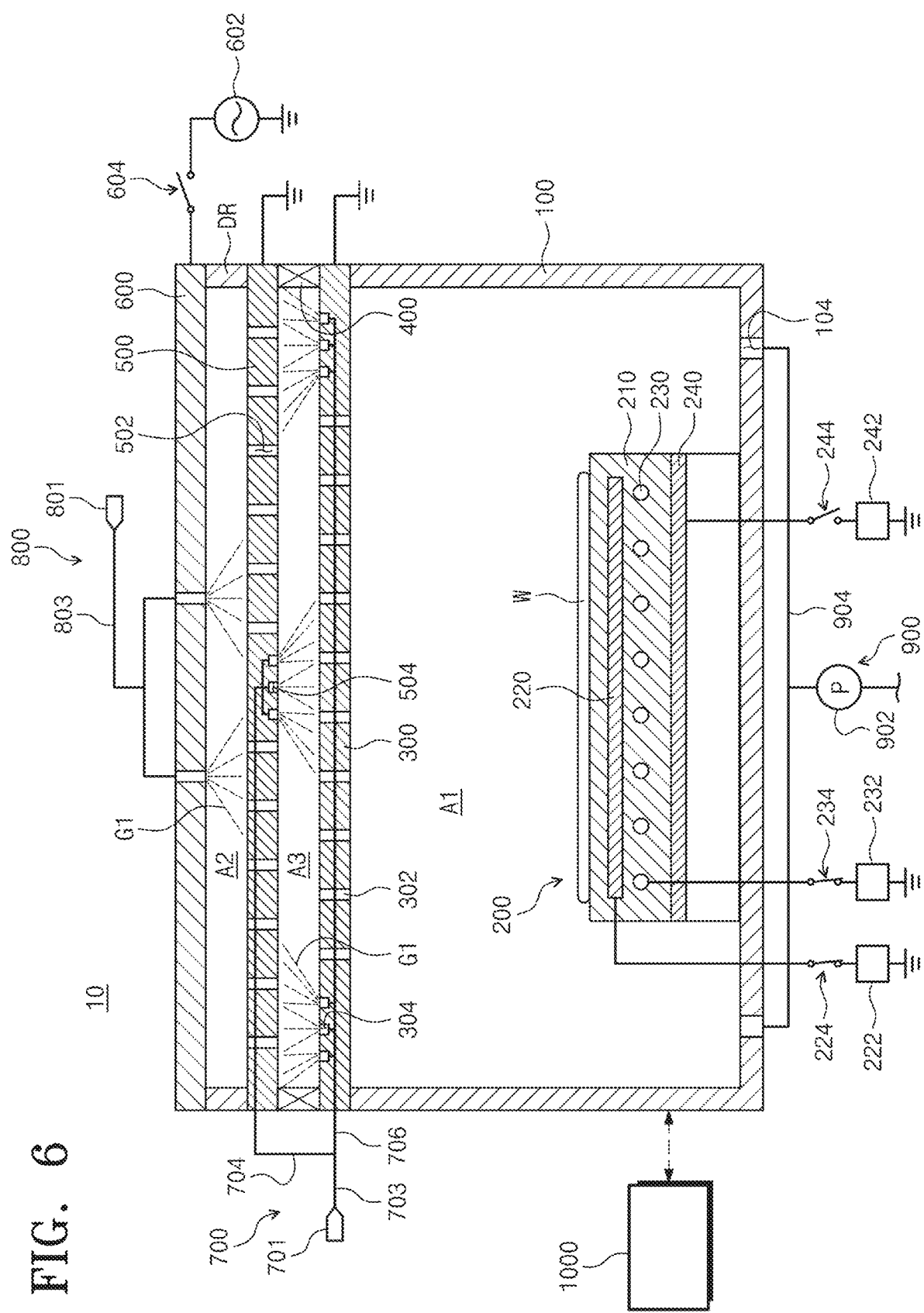
FIG. 6 illustrates the substrate treating apparatus in which the pressure stabilization is performed in the chucking-pressure stabilizing step of FIG. 4.
Figure 7:
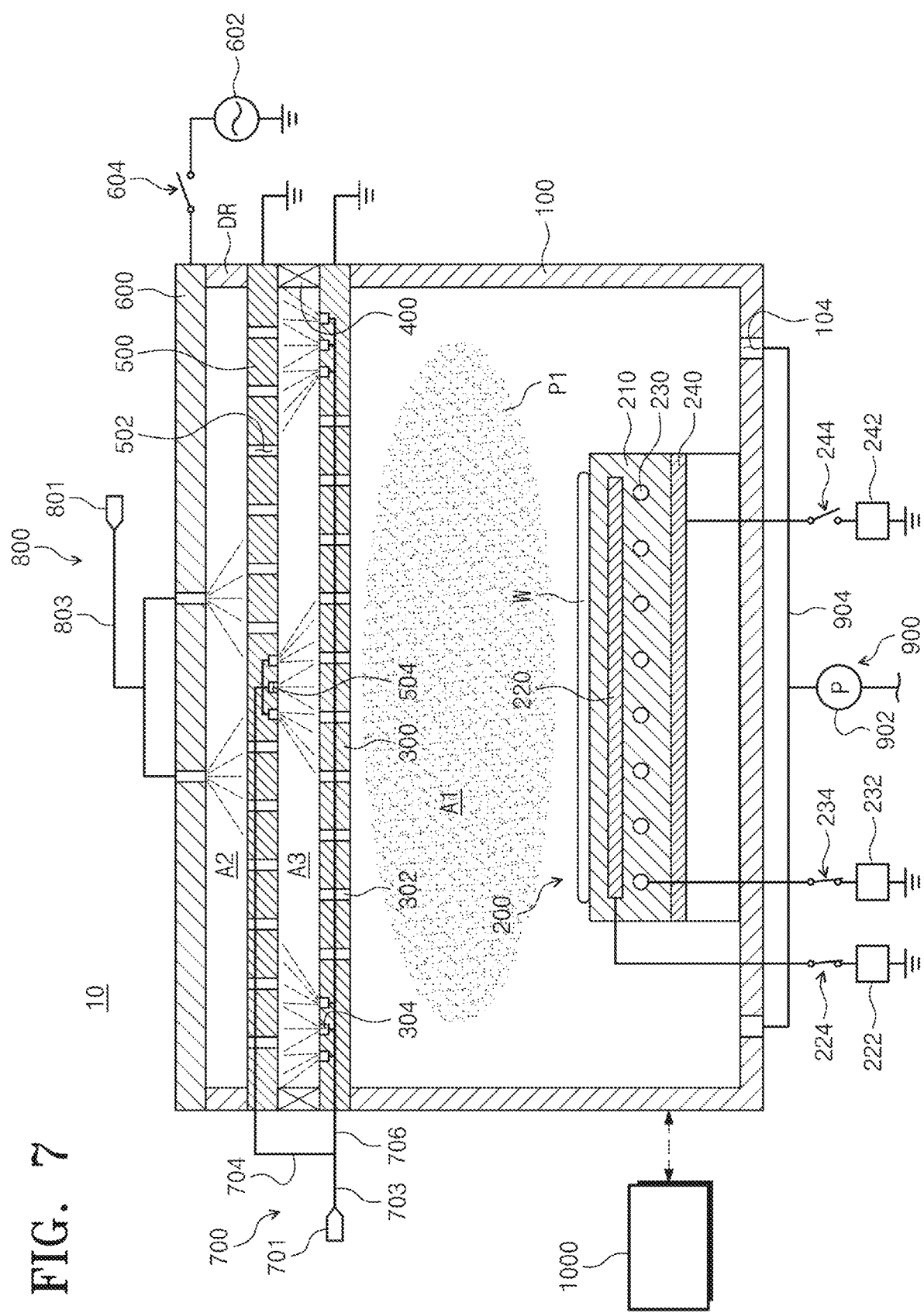
FIG. 7 illustrates a state of performing an ion treating step of FIG. 4.

FIG. 3 is a flowchart showing a substrate treating method according to an embodiment of the inventive concept, and FIG. 4 is a graph schematically showing a treating condition of a substrate treatment apparatus when performing the substrate treating method of FIG. 3. Referring to FIG. 3 and FIG. 4, the substrate treating method according to an embodiment of the inventive concept may include a standby step S10, a first treating step S20, a first exhaust step S30, a second treating step S40, and a second exhaust step S50. The standby step S10, the first treating step S20, the first exhaust step S30, the second treating step S40, and the second exhaust step S50 may be carried out sequentially.

Hereinafter, a process gas supplied by a first gas supply unit 700 is referred to as a first process gas G1, and a process gas supplied by a second gas supply unit 800 is referred to as a second process gas G2. In addition, a plasma generated by a process gas excited in a treating space A1 is referred to as a first plasma P1, and a plasma generated by a process gas excited in a plasma space A2 is referred to as a second plasma P2. When the second plasma P2 generated in the plasma space A2 is introduced into the treating space A1, an ion is removed by an ion blocker 500, and thus the second plasma P2 may refer to a plasma from which the ion is removed. In addition, since the ion are not removed from the first plasma P1 generated in the treating space A1 by the ion blocker 500, the first plasma P1 may refer to a plasma including the ion.

In the standby step S10, a substrate W to be treated stands by until it is taken into the treating space A1. If a standby time of waiting for the substrate W to be taken in (that is, a time for which the standby step S10 continues) is more than a set time, a condition of the substrate treating apparatus 10 may be degraded. Accordingly, if necessary, when the standby time of waiting for the substrate W to be taken in is equal to or greater than the set time, at least one of a first treating step S20, a first exhaust step S30, and a second exhaust step S50 may be performed while the substrate W is not taken into the treating space A1.

The first treating step S20 may be performed after the standby step S10. The first treating step S20 may include a chucking-pressure stabilizing step S21 and an ion treating step S22. In the chucking-pressure stabilizing step S21, the support unit 200 may chuck the substrate W with an electrostatic force (see FIG. 5). In addition, in this case, the electrostatic electrode switch 224 may be turned on. Accordingly, a power applied by the electrostatic electrode power source 222 may be transmitted to the electrostatic electrode 220. When the power is applied to the electrostatic electrode 220, an electric field generating a pulling force in a downward direction may be formed on the substrate W. Such an electric field may not only chuck the substrate W, but may also cause the ion I to be described later to have an anisotropic state (i.e., a state in which the ion I flows vertically in a downward direction).

In addition, the chucking-pressure stabilizing step S21 may be a step of stabilizing a pressure of the treating space A1 so that a treating of a substrate W in the ion treating step S22 may be stably performed. In the chucking-pressure stabilizing step S21, the gas supply units 700 and 800 may supply the process gases G1 and G2 (see FIG. 6). For example, the first process gas G1 supplied by the first gas supply unit 700 to the mixing space A3 may be introduced into the treating space A1 through the hole 302. The second process gas G2 supplied by the second gas supply unit 800 to the plasma space A2 may be introduced into the treating space A1 through the through hole 502 and the hole 302. As the process gases G1 and G2 are introduced into the treating space A1, the pressure of the treating space A1 may reach a set pressure and be constantly maintained at the set pressure (pressure stabilization).

In addition, the first process gas G1 supplied by the first gas supply unit 700 in the chucking-pressure stabilizing step S21 may be a gas including a hydrogen, such as an $NH_3$ or an $H_2$. In addition, the second process gas G2 supplied by the second gas supply unit 800 in the chucking-pressure stabilizing step S21 may be an inert gas including an He, an Ar, an Xe, and an $N_2$. The process gases G1 and G2 supplied in the first treating step S20 may include a gas including one of an $H_2$, an He, and an Ar, and a gas including a H and/or an N (for example, an $NH_3$).

Figure 8:
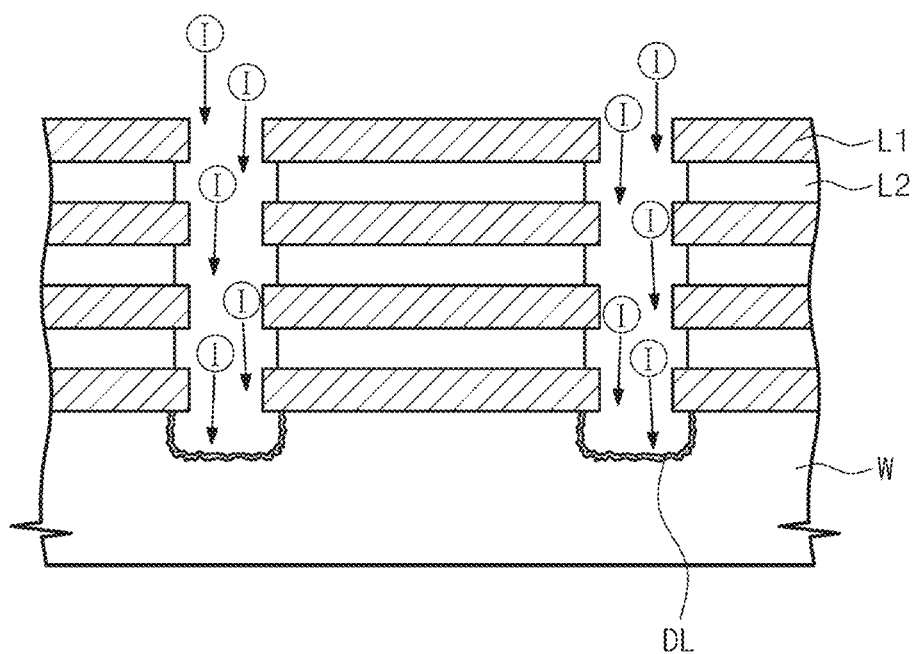
FIG. 8 illustrates the substrate in which the ion treating step is performed.

After the supply of the process gases G1 and G2 to the treating space A1 and a set time elapses, the bottom power modules 242 and 244 may apply a power to the bottom electrode 240 at the ion treating step S22. When the power is applied to the bottom electrode 240, an electric field may be formed at the treating space A1. The electric field formed at the treating space A1 may generate a first plasma P1 by exciting the process gases G1 and G2 (see FIG. 7). The first plasma P1 generated at the treating space A1 may include the ion I because it is directly generated at the treating space A1 without passing through the ion blocker 500. Since the ion I included in the first plasma P1 has a polarity, the ions I may have an anisotropy by the electrostatic force formed by the electrostatic electrode 220. Accordingly, as illustrated in FIG. 8, the ions I may enter the hole H and be appropriately transferred to the damage layer DL, and the first thin film L1 relatively protruding from the hole H may be further treated with the ions I than the second thin film L2. That is, a part of the hole H may be treated by ions I, and the other part of the hole H may not be treated by ions I.

During the first treating step S20, a temperature of the chuck 200 may be controlled to 50° C. to 150° C., and more preferably, 85° C. to 130° C. In addition, during the first treating step S20, the pressure of the treating space A1 may be controlled to be 5 mTorr to 150 mTorr, more preferably, to 10 mTorr to 100 mTorr, by the exhaust unit 900. In addition, during the first treating step S20, 50 W to 1500 W, more desirably, 100 W to 1000 W, may be applied to the bottom electrode 240. In addition, a process gas supplied during the first treating step S20, for example, the first process gas G1 including an NH$_3$, may be supplied to the treating space A1 at 50 sccm to 1000 sccm, more preferably, at 100 sccm to 1000 sccm.

Figure 9:
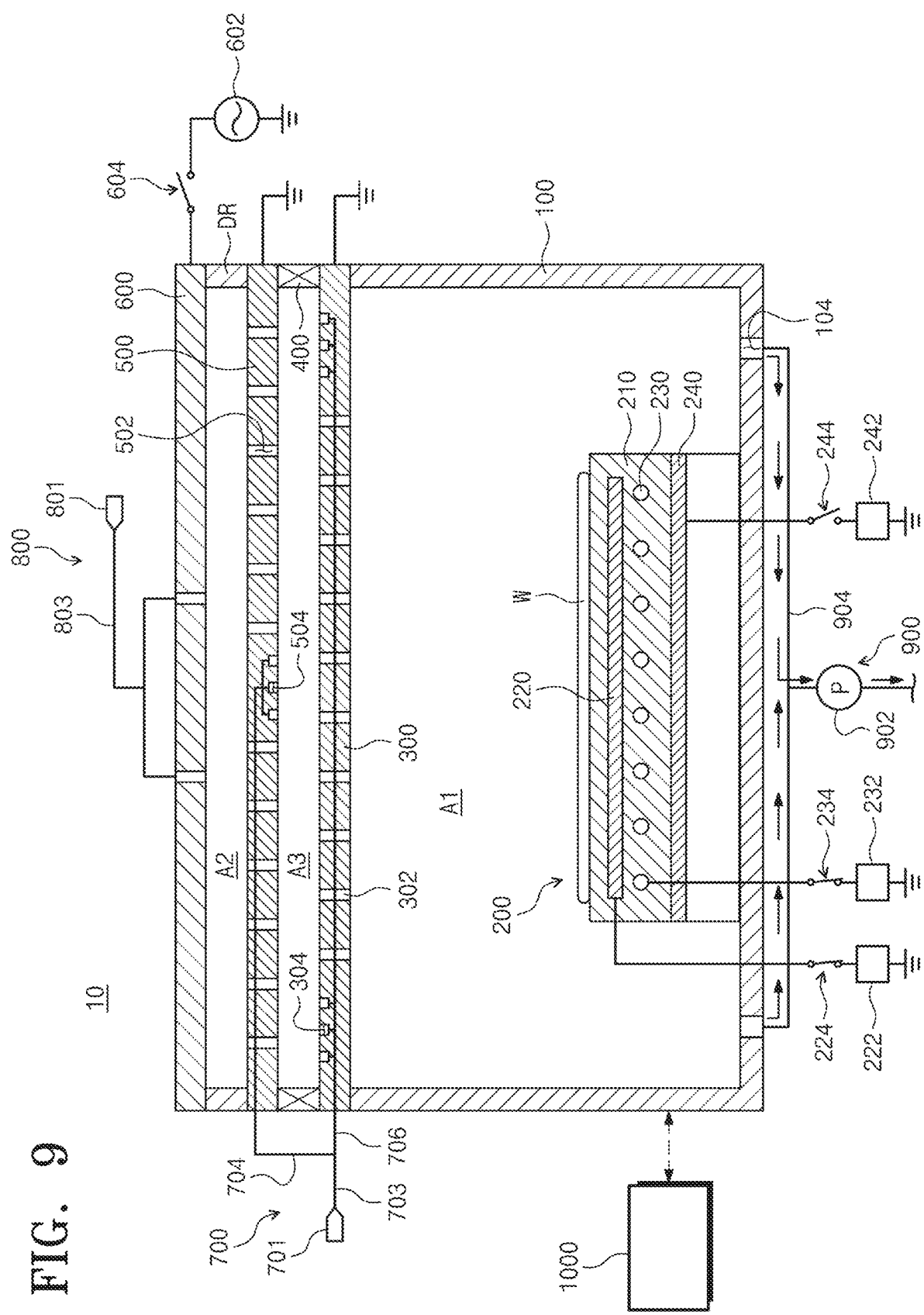
FIG. 9 illustrates a state in which a first exhaust step of FIG. 4 is performed.
Figure 10:
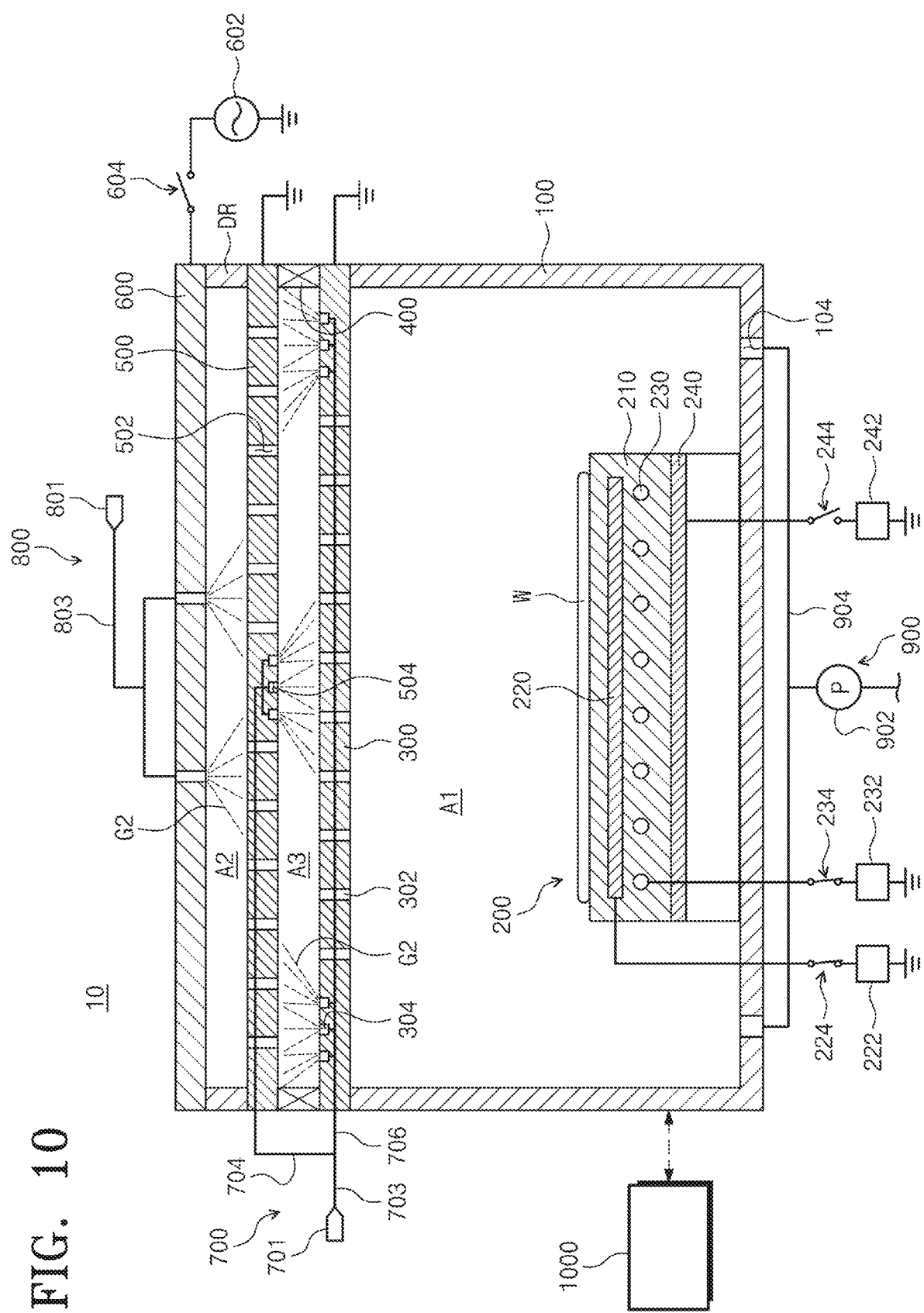
FIG. 10 illustrates the substrate treating apparatus performing the pressure stabilizing step of FIG. 4.
Figure 11:
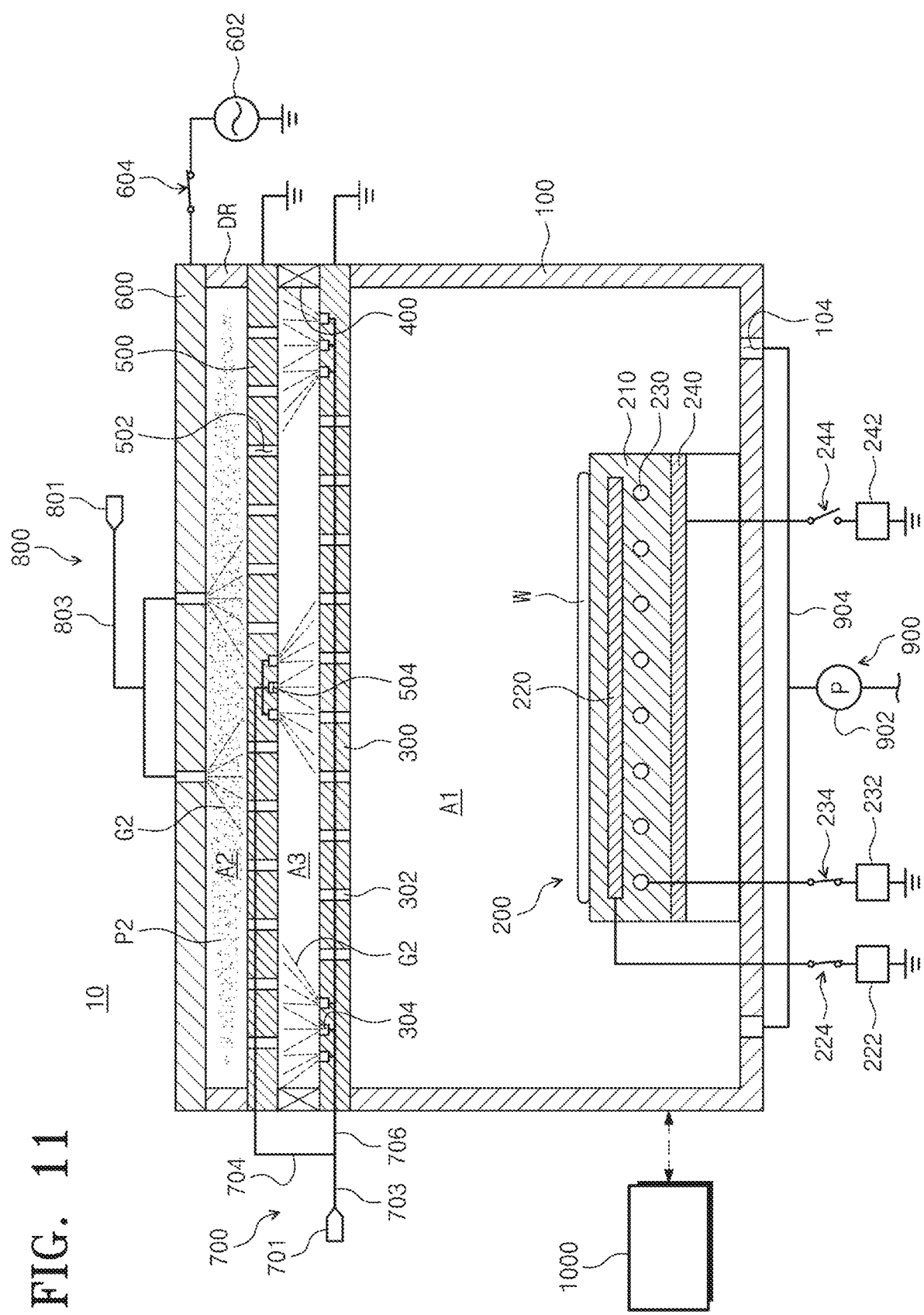
FIG. 11 illustrates the substrate treating apparatus performing a radical treating step of FIG. 4.

In the first exhaust step S30, the exhaust unit 900 may exhaust an atmosphere of the treating space A1 (see FIG. 9). In the first exhaust step S30, the treating space A1 may exhaust process by-products, the process gases G1 and G2 supplied at the first treating step S20, and the first plasma P1 remaining in the treating space A1 to an outside of the treating space A1.

The second treating step S40 may be performed after the first exhaust step S30. The second treating step S40 may include a pressure stabilizing step S41 and a radical treating step S42. The pressure stabilizing step S41 may be a step of stabilizing the pressure of the treating space A1 so that a substrate W treatment in the radical treating step S42 may be stably performed. In the pressure stabilizing step S41, the gas supply units 700 and 800 may supply the process gases G1 and G2 (see FIG. 10). For example, the first gas supply unit 700 may supply the first process gas G1 to the mixing space A3. The second gas supply unit 800 may supply the second process gas G2 to the plasma space A2. In addition, the process gases G1 and G2 supplied to the plasma space A2 and the mixing space A3 may be introduced into the treating space A1 to stabilize the pressure of the treating space A1.

In addition, the first process gas G1 supplied by the first gas supply unit 700 in the pressure stabilizing step S41 may be a gas including a hydrogen, such as an NH$_3$ or an H$_2$. In addition, the second process gas G2 supplied by the second gas supply unit 800 in the chucking-pressure stabilizing step S21 may include a fluorine (e.g., NF$_3$, F$_2$) and an inert gas (e.g., He, Ar, Xe, N$_2$).

After a supply of the process gases G1 and G2 starts and the set time elapses, the top power modules 602 and 604 may apply a power to the top electrode 600 at the radical treating step S42. When the power is applied to the top electrode 600, an electric field may be formed at the plasma space A2. The electric field formed at the plasma space A2 may generate a second plasma P2 by exciting the second process gas G2 (see FIG. 10).

Figure 12:
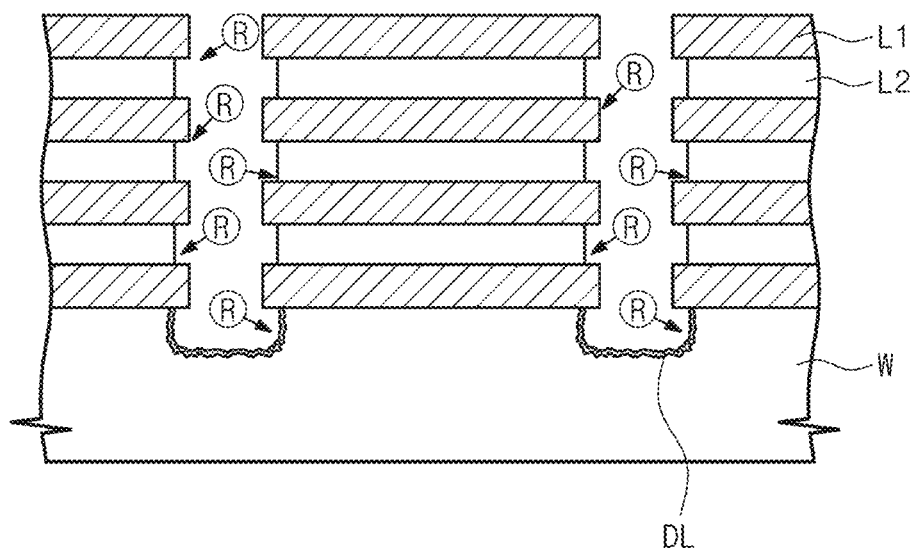
FIG. 12 illustrates a substrate in which the radical treating step is performed.
Figure 13:
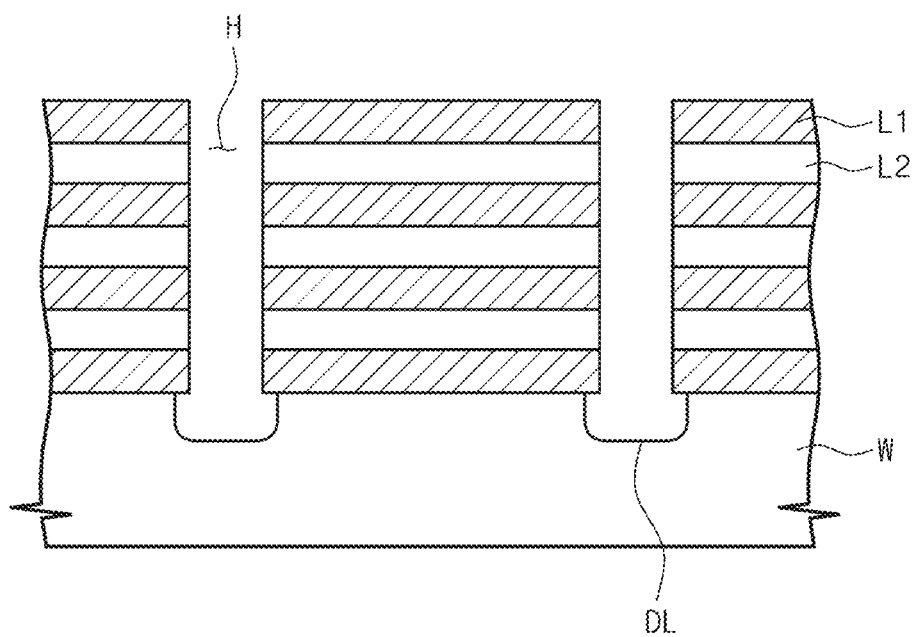
FIG. 13 illustrates a substrate in which the ion treatment and the radical treatment have been performed.

The second plasma P2 may flow to the mixing space A2 through the ion blocker 500. The second plasma P2 introduced into the mixing space A2 may be in a state in which ions I have been removed by the ion blocker 500. The second plasma P2 in a state in which the ions I are removed may be mixed with the first process gas G1 supplied to the mixing space A2. The second plasma P2 from which the ions I are removed is mixed with the first process gas G1 to flow into the treating space A1 to treat the substrate W (see FIG. 12). In this case, since the radical R from which the ions I have been removed has a neutrality, the radical R may have isotropic properties. In addition, a difference in a selection ratio occurs between a region treated with ions I and a region not treated with ions at the first treating step S20. Accordingly, as shown in FIG. 12, it is possible to improve a roughness of a hole H and effectively remove a damage layer DL.

During the second treating step S40, a temperature of the chuck 200 may be controlled to 50° C. to 150° C., more preferably 85° C. to 130° C. In addition, while the second treating step S40 is performed, a pressure of the treating space A1 may be controlled to be 0.5 Torr to 15 Torr, more preferably 1 Torr to 10 Torr, by the exhaust unit 900. In addition, while the second treating step S40 is being performed, 20 W to 500 W, more desirably, 50 W to 500 W may be applied to the top electrode 600. In addition, the process gas supplied during the second treating step S40, for example, the first process gas G1 including an NH$_3$, may be supplied to the mixing space A3 at 50 sccm to 1500 sccm, more preferably 100 sccm to 1000 sccm. In addition, the process gas supplied during the second treating step S40, for example, the second process gas G2 including an NF$_3$, may be supplied to the plasma space A3 at 5 sccm to 800 sccm, more desirably 10 sccm to 500 sccm.

In addition, the first treating step S20 and the second treating step S40 may be repeatedly performed.

Similar to the first exhaust step S30, the exhaust unit 900 may exhaust an atmosphere of the treating space A1 at the second exhaust step S50.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating method for treating a substrate at which thin films are stacked and a hole is formed comprising:

treating the substrate using a first ionized plasma including ions, which is a first treating operation;

exhausting a first atmosphere including the first plasma from a first treatment space, which is a first exhaust operation performed after the first treating operation;

treating the substrate using a second ionized plasma removed of ions, which is a second treating operation; and exhausting a second atmosphere including the second plasma from the first treating space, which is the second exhaust operation performed after the second treating operation, wherein during at least a part of a period during which the first treating operation is being performed the substrate is chucked with an electrostatic force, wherein the treating the substrate using the first plasma includes striking the first plasma in the first treatment space, and the first plasma has anisotropic properties due to the presence of ions, and the treating the substrate using the second plasma includes striking the second plasma in a second treatment space and allowing the second plasma to flow into the first treatment space after ion removal, and the second plasma has isotropic properties due to being electrically neutral, wherein a third treatment space is above the first treatment space and the second treatment space is above the third treatment space, and wherein the treating the substrate with the second plasma includes supplying a process gas to the third treatment space and showering the process gas supplied to the third treatment space from the third treatment space to the second treatment space.

2. The substrate treating method of claim 1, wherein
the first treating operation generates the first plasma by supplying a process gas to the first treatment space within a chamber, and
the second treating operation generates the second plasma by supplying a process gas to the second treatment space within the chamber.

3. The substrate treating method of claim 2, wherein
the first treatment space is a space for placing the substrate thereon, and
the removing of the ions of the second plasma is done by an ion blocker positioned between the first treatment space and the second treatment space.

4. The substrate treating method of claim 2, wherein the first treating operation forms an electric field at the first treatment space after a set time has passed since a supplying of a process gas for exciting to the first plasma is started.

5. The substrate treating method of claim 2, wherein the second treating operation forms an electric field at the second treatment space after a set time has passed since a supplying of a process gas for exciting to the second plasma is started.

6. The substrate treating method of claim 2, wherein between the first treating operation and the second treating operation an exhaust operation for exhausting the first operation is performed.

7. The substrate treating method of claim 2, wherein a temperature of a chuck supporting the substrate while the substrate is being treated is controlled to 85° C. to 130° C.

8. The substrate treating method of claim 2, wherein a pressure of the first treatment space at the first treating operation is controlled to 10 mTorr to 100 mTorr, and
a pressure of the first treatment space at the second treating operation is controlled to 1 Torr to 10 Torr.

9. The substrate treating method of claim 2, wherein
100 W to 1000 W is applied to a first electrode forming an electric field at the first treatment space in the first treating operation, and
50 W to 100 W is applied to a second electrode forming an electric field at the second space in the second treating operation.

10. The substrate treating method of claim 2, wherein a process gas excited to the first plasma includes a hydrogen, and
a process gas excited to the second plasma includes a fluorine.

11. The substrate treating method of claim 10, wherein the process gas excited to the first plasma is supplied to the first treatment space at 100 sccm to 1000 sccm.

12. The substrate treating method of claim 10, wherein the process gas excited to the second plasma is supplied to the second treatment space at 10 sccm to 500 sccm.

13. The substrate treating method of claim 1,
wherein the treating the substrate with the first plasma includes supplying a process gas to the third treatment space and showering the process gas supplied to the third treatment space from the third treatment space to the first treatment space.

14. The substrate treating method of claim 1, wherein the treating the substrate with the second plasma includes neutralizing the ions in the second plasma with an ion blocker separating the second treatment space from the first treatment space.

15. A substate treating method for treating a substrate at which thin films are stacked and a hole is formed comprising:
treating the substrate using a first ionized plasma including ions, which is a first treating operation; and
exhausting a first atmosphere including the first plasma from a first treating space, which is a first exhaust operation performed after the first treating operation,
treating the substrate using a second ionized plasma removed of ions, which is a second treating operation,
exhausting a second atmosphere including the second plasma from the first treating space, which is the second exhaust operation performed after the second treating operation,
wherein during at least a part of a period during which the first treating operation is being performed the substrate is chucked with an electrostatic force,
wherein the treating the substrate using the first plasma includes striking the first plasma in the first treating space, and the first plasma has anisotropic properties due to the presence of ions, and
the treating the substrate using the second plasma includes striking the second plasma in a second treatment space and allowing the second plasma to flow into the first treating space after ion removal, and the second plasma has isotropic properties due to being electrically neutral,
wherein a third treatment space is above the first treating space and the second treatment space is above the third treatment space, and
wherein the treating the substrate with the second plasma includes supplying a first process gas in the second treatment space and supplying a second process gas in the third treatment space.

16. A substrate treating method for treating a substrate at which at least two or more thin films are stacked, each two thin films among the at least two or more thin films having a selection ratio with respect to a same species, the selection ratio greater than unity or less than unity with respect to each two thin films, the substrate treating method comprising:
treating the substrate, which has been chucked with an electrostatic force, using a first ionized plasma including ions, which is a first treating operation;
exhausting a first atmosphere including the first plasma from a first treating space, which is a first exhaust operation performed after the first treating operation;
treating the substrate using a second ionized plasma removed of ions, which a second treating operation performed after the first treating operation; and
exhausting a second atmosphere including the second plasma from the first treating space, which is a second exhaust operation performed after the second treating operation,
wherein the first plasma is a plasma excited from a process gas including a hydrogen, an argon, and a helium,
the second plasma is a plasma excited from a process gas including a fluorine,
the treating the substrate using the first plasma includes striking the first plasma in a first treatment space, and the first plasma has anisotropic properties due to the presence of ions, and
the treating the substrate using the second plasma includes striking the second plasma in a second treatment space, and allowing the second plasma to flow into the first treatment space after ion removal, and the second plasma has isotropic properties due to being electrically neutral, wherein a third treatment space is above the first treatment space and the second treatment space is above the third treatment space, and wherein the treating the substrate with the second plasma includes supplying a process gas to the third treatment space and showering the process gas supplied to the third treatment space from the third treatment space to the second treatment space.

17. The substrate treating method of claim 16, wherein the first treatment space at which the first plasma is generated and the second treatment space at which the second plasma is generated is divided by a grounded plate.

18. The substrate treating method of claim 16, wherein at the second treating operation, a process gas including a nitrogen and a hydrogen is supplied to the second plasma.

* * * * *